United States Patent
Gaunekar et al.

(10) Patent No.: US 12,525,571 B1
(45) Date of Patent: Jan. 13, 2026

(54) COMPLIANT LOCATING STRUCTURE FOR A BOND HEAD ASSEMBLY

(71) Applicant: ASMPT Singapore Pte. Ltd., Singapore (SG)

(72) Inventors: Ajit Shriman Gaunekar, Singapore (SG); Mantian Ye, Hong Kong (CN); Ho Chong Wong, Hong Kong (CN); Gary Peter Widdowson, Hong Kong (CN); Chi Ming Chong, Hong Kong (CN)

(73) Assignee: ASMPT SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 18/768,316

(22) Filed: Jul. 10, 2024

(51) Int. Cl.
*B23K 1/00* (2006.01)
*B23K 3/00* (2006.01)
*B23K 3/02* (2006.01)
*H01L 23/00* (2006.01)
*B23K 101/40* (2006.01)

(52) U.S. Cl.
CPC ............ *H01L 24/75* (2013.01); *B23K 1/0016* (2013.01); *B23K 3/025* (2013.01); *B23K 2101/40* (2018.08); *H01L 2224/75984* (2013.01)

(58) Field of Classification Search
CPC ....... H01L 21/6838; H01L 2224/81203; H01L 2224/83203; H01L 24/81; H01L 24/83; H01L 21/67144; H01L 2224/80203; H01L 2224/81191; H01L 21/67132; H01L 21/67259; H01L 2224/75; B23K 3/08
See application file for complete search history.

(56) References Cited

U.S. PATENT DOCUMENTS

| | | | | |
|---|---|---|---|---|
| 4,634,043 A | * | 1/1987 | Avedissian | B23K 3/08 228/180.21 |
| 5,169,196 A | * | 12/1992 | Safabakhsh | H05K 13/0409 271/97 |
| 8,037,918 B2 | * | 10/2011 | Wang | H01L 21/6838 414/737 |
| 8,632,112 B2 | * | 1/2014 | Kim | B21D 43/18 294/183 |
| 9,281,290 B2 | * | 3/2016 | Hung | H01L 24/75 |
| 9,381,652 B2 | * | 7/2016 | Abe | B25J 15/0616 |
| 2008/0066511 A1 | * | 3/2008 | Kim | B21D 43/18 72/20.1 |

(Continued)

*Primary Examiner* — Erin B Saad
(74) *Attorney, Agent, or Firm* — OSTROLENK FABER LLP

(57) ABSTRACT

A bond head assembly includes a collet and a planar compliant locating structure having a plane. The collet is operative to hold a die during a bonding process. The planar compliant locating structure includes a first flexural element that is positioned to contact a first side surface of the collet and a second flexural element that is positioned to contact a second side surface of the collet. The first and second side surfaces of the collet are substantially orthogonal to each other. Each of the first and second flexural elements is arranged such that a portion thereof is deflectable by movement of the collet against the flexural element, thereby causing the first or second flexural element to exert a biasing force against the first or second side surface of the collet along the plane of the compliant locating structure to restrict positional shifts of the collet towards the flexural element.

20 Claims, 3 Drawing Sheets

(56) References Cited

U.S. PATENT DOCUMENTS

| | | | | |
|---|---|---|---|---|
| 2010/0078125 A1* | 4/2010 | Fujino | ............... | H01L 21/6838 |
| | | | | 156/285 |
| 2012/0312863 A1* | 12/2012 | Sueoka | ............... | B23K 3/0471 |
| | | | | 228/104 |
| 2013/0316294 A1* | 11/2013 | Wan | ............... | H01L 24/81 |
| | | | | 432/9 |
| 2014/0027068 A1* | 1/2014 | Hung | ............... | H01L 24/75 |
| | | | | 156/583.1 |
| 2015/0027616 A1* | 1/2015 | Chan | ............... | H01L 24/83 |
| | | | | 156/499 |
| 2015/0035302 A1* | 2/2015 | Ryu | ............... | B25J 11/0095 |
| | | | | 294/65 |
| 2015/0325466 A1* | 11/2015 | Wang | ............... | H01L 21/68728 |
| | | | | 279/3 |
| 2023/0031977 A1* | 2/2023 | Yoshimoto | ............... | H01L 24/75 |

* cited by examiner

COMPLIANT LOCATING STRUCTURE FOR A BOND HEAD ASSEMBLY

FIELD OF THE INVENTION

The invention relates to semiconductor die bonding, and in particular to a die bond head assembly with a compliant locating structure for restricting undesirable positional shifts of a collet of the bond head assembly during a die bonding process.

BACKGROUND

In a semiconductor die bonding system, a semiconductor die or chip having solder bumps and copper pillar bumps thereon is attached or bonded to a substrate via a die bonding process. The die bonding process may comprise thermocompression die bonding, which involves heating a bond head holding the die while applying force on the die during bonding. During the die bonding process, solder joints or interconnections are formed between the die and substrate. The bond head assembly of the die bonding system may thus include a heater coupled to a collet of the bond head for heating the die. In one example, the collet is coupled to the heater via a first vacuum channel provided on the heater and configured to hold the die via a second vacuum channel provided on the heater during bonding.

After the collet undergoes heating and cooling by the heater through multiple bonding cycles, it has been observed that the position of the collet relative to the heater may shift in different directions along a plane on which the collet is secured. Various factors contribute to this positional shift, including differences in thermal expansion among the heater, collet, die, and lower part of the substrate, vacuum holding conditions, friction between the collet and heater, as well as the parallelism and coplanarity of the die and collet. The precise positioning of the collet relative to the heater is crucial during the bonding process, particularly when the collet is designed with a specific form factor to accommodate the die. Misalignment between the collet and die may significantly impact the quality of bonding, potentially leading to severe issues such as die crack during the bonding process.

One conventional method for correcting the positional shifts of the collet is to continually reposition the collet relative to the heater. The repositioning process may include monitoring the position of the collet, detaching the collet from the heater, aligning it with the die and affixing it back onto the heater of the bond head assembly based on the monitored position. This repositioning process increases the machine cycle time and reduces the throughput of the machine.

Another conventional solution is to use rigid stoppers to restrict any shifting of the collet during the bonding process. FIG. 1 is a plan view of a conventional guide 1 that includes multiple rigid stoppers 3a-3f for restricting positional shifts of the collet 2 when conducting bonding. As shown in FIG. 1, the conventional guide 1 aims to constrain movement of the collet 2 mechanically to limit positional shifts of the collet 2. This is achieved by providing multiple rigid contact points on each side, i.e., stoppers 3a-3c on the right side R of the collet 2 and more stoppers 3d-3f on the left side L of the collet 2.

However, this approach has several drawbacks. During the assembly of the rigid stoppers at room temperature, small gaps in the order of a few tens of microns must be maintained between the collet 2 and the stoppers 3a-3f. Upon reaching a process temperature for conducting bonding, the collet 2 is expected to expand due to thermal expansion and shift to contact the stoppers, thereby closing the gaps. From this point, any further tendency for the collet 2 to move relative to the guide 1 is restricted by the stoppers 3a-3f. However, in practice, it is nearly impossible to ensure that the initial gap is precisely equal to the expected extent of thermal expansion of the collet 2. This is due to the complexity of the temporal and spatial temperature variations during the bonding process and the unpredictable frictional conditions at each point of the collet-heater interface. If the gaps are too small, there is a risk that after heating, the collet may crack due to high compressive stress imposed by the stoppers 3a-3f on opposite sides of the collet 2. Conversely, if the gaps are too large, there may still be residual gaps on one or more sides of the collet 2 even after full thermal expansion of the collet. The residual gaps would make the stoppers 3a-3f ineffective in preventing the collet 2 from undesirable shifting. Additionally, the conventional rigid stoppers using the kinematic principle of a multi-point datum to restrict undesirable positional shifts of the collet 2 may instead serve to impose higher localized stress concentrations on the collet 2.

It would therefore be beneficial to provide an improved solution for restricting the undesirable positional shifts of the collet when conducting die bonding.

SUMMARY OF THE INVENTION

It is thus an object of this invention to seek to provide an improved bond head assembly and die bonding system which can solve at least some of the drawbacks in the conventional solutions.

According to a first aspect of the invention, there is provided a bond head assembly. The bond head assembly includes a collet and a planar compliant locating structure having a plane. The collet is operative to hold a die during a die bonding process. The compliant locating structure includes a first flexural element that is positioned to contact a first side surface of the collet and a second flexural element that is positioned to contact a second side surface of the collet, the first and second side surfaces of the collet being substantially orthogonal to each other. Each of the first and second flexural elements is arranged such that a portion thereof is deflectable by movement of the collet against the flexural element, thereby causing the first or second flexural element to exert a biasing force against the first or second side surface of the collet along the plane of the compliant locating structure to restrict positional shifts of the collet towards the flexural element.

According to a second aspect of the invention, there is provided a die bonding system. The bonding system includes a bonding station for holding a substrate to which a die is to be bonded, and a bond head assembly configured for bonding the die to the substrate. The bond head assembly includes a collet and a planar compliant locating structure having a plane. The collet is operative to hold a die during a die bonding process. The compliant locating structure includes a first flexural element that is positioned to contact a first side surface of the collet and a second flexural element that is positioned to contact a second side surface of the collet, the first and second side surfaces of the collet being substantially orthogonal to each other. Each of the first and second flexural elements is arranged such that a portion thereof is deflectable by movement of the collet against the flexural element, thereby causing the first or second flexural element to exert a biasing force against the first or second side surface of the collet along the plane of the compliant locating structure to restrict positional shifts of the collet towards the flexural element.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Figure 1:
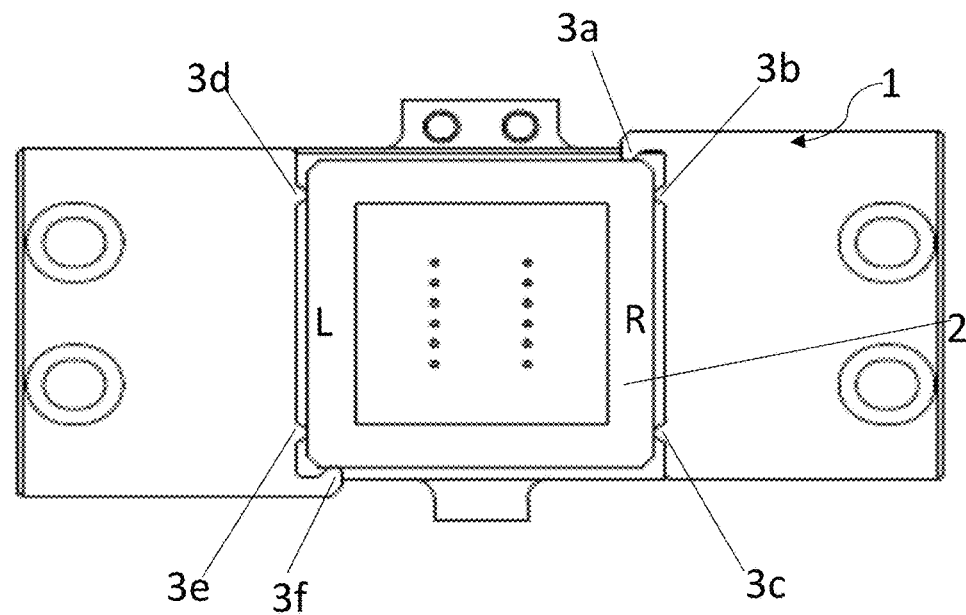
FIG. 1 is a plan view of a conventional guide that includes six rigid stoppers for restricting positional shifts of a collet during a die bonding process.

Before discussing the embodiments in any more detail, an overview will first be provided. Embodiments of the invention provide a compliant locating structure for a die bond head assembly for bonding a die to a substrate. In some embodiments, the compliant locating structure is designed to include first and second flexural elements. In use, the first and second flexural elements are positioned to contact first and second side surfaces of the collet, respectively. The first and second side surfaces of the collet are substantially orthogonal to each other. Each of the first and second flexural elements is arranged such that a portion thereof is deflectable by movement of the collet against the flexural element. The deflection causes the first or second flexural element to exert a biasing force against the first or second side surface of the collet along the plane of the compliant locating structure to counter and restrict positional shifts of the collet towards the flexural element.

In some embodiments, the bond head assembly includes a heater to which the collet is coupled. The heater is configured and operative for maintaining and controlling the temperature of the die and the substrate during the bonding process. The complaint locating structure is securely mounted on a heater clamping structure for securing the heater.

In some embodiments, each of the first and second flexural elements includes a contact portion. The contact portion is configured to engage with the first or second side surface of the collet to impart the biasing force onto the collet. In some embodiments, the contact portion includes multiple separate contact surfaces to contact respective portions of the first or second side surface of the collect.

In some embodiments, each of the first and second flexural elements includes a pivotal portion and a linear portion. The pivotal portion is configured to flex to enable rotation of the contact portion, and the linear portion is configured to enable linear translation of the contact portion due to movement of the collet relative to the flexural element.

In some embodiments, the pivotal portion is positioned between the contact portion and the linear portion to operatively connect the contact portion to the linear portion.

In some embodiments, each of the first and second flexural elements is arranged to further include a gap formed between the contact portion and the linear portion to allow the contact portion to pivot about the pivotal portion.

In some embodiments, each of the first and second flexural elements further includes a plurality of protrusions extending from the contact portion and/or the linear portion, which act as stoppers against the rotation of the contact portion about the pivotal portion beyond a predetermined range of angles. In some embodiments, the plurality of protrusions includes a first pair of protrusions extending from the contact portion towards the linear portion and a second pair of protrusions extending from the linear portion towards the contact portion.

In some embodiments, the linear portion of each flexural element includes a slotted plate having a slot. The linear portion is designed to allow the perimeter of the slot to deflect away from the contact portion when the collect moves towards and contacts the contact portion. In some embodiments, the slotted plate includes a first beam, a second beam parallel to the first beam, and joining connectors at opposite ends of the first and second beams to connect the first beam to the second beam to form the slot. In one example, the first and second beams and one of the joining connectors form a U-shaped perimeter of the slot.

Alternatively, in some embodiments, the linear portion of each flexural element includes a cantilevered section configured to deflect away from the contact portion when the collect moves towards and contacts the contact portion.

In some embodiments, the first and second flexural elements are formed integrally with each other to form an integrated locating piece. The first and second flexural elements may share a same mounting position. In some embodiments, the first and second flexural elements are formed integrally in the form of an L-shaped structure. In some embodiments, the first and second flexural elements are cut out from a single metallic plate.

In some embodiments, the complaint locating structure further includes a third flexural element and a fourth flexural element. The third and fourth flexural elements are positioned to contact third and fourth side surfaces of the collet respectively. The third and fourth side surfaces of the collet are substantially orthogonal to each other and are substantially parallel to the first and second side surfaces of the collet respectively. Each of the third and fourth flexural elements is arranged such that a portion thereof is deflectable by movement of the collet against the flexural element, thereby causing the third or fourth flexural element to exert a biasing force against the third or fourth side surface of the collet along the plane of the compliant locating structure to counter and restrict positional shifts of the collet towards the flexural element. In some embodiments, the third and fourth flexural elements may be formed integrally with each other to form another integrated locating piece. Thus, the compliant locating structure includes two integrated locating pieces.

In some embodiments, each flexural element that includes the contact portion, linear portion and pivotal element is designed for restricting positional shifts of the collet along a predetermined direction. The linear portion is deflected when the collet moves along the predetermined direction to contact the contact portion due to thermal expansion or other factors. As a result, the linear portion generates a biasing force that is exerted against the side surface of the collet, thereby restricting positional shifts of the collet along the predetermined direction.

In some embodiments, the pivotal portion may be in the form of an elongated flexible metallic strip. The width and length of the pivotal portion are determined according to actual needs as long as the pivotal portion enables the contact portion to be pivotable relative to the linear portion within a predetermined range of angles. The use of the pivotal portion allows for area contact of the compliant locating structure and the collet, even if the collet itself does not have a perfect shape or if there are any imperfections in the installation of the compliant locating structure.

To distribute stress across a larger area, extend the lifespan of each flexural element, and lower the cost of manufacturing, at least one of the contact portion and the linear portion includes an indentation. Such an indentation lengthens the pivotal portion in the predetermined direction. The indentation may be provided on one of the two facing surfaces connected to the pivotal portion. These two facing surfaces include one surface of the contact portion and one surface of the linear portion.

In some embodiments, the contact portion includes a first surface and a second surface that are opposite to each other. The first surface is configured to contact the side surface of the collet and the second surface is configured to connect the linear portion through the pivotal portion. The first surface of the contact portion may include a notch or cut-out sized and shaped to prevent the compliant locating structure from contacting other component of the bond head assembly. The other component includes high voltage terminals of the heater of the bond head assembly.

Figure 2A:
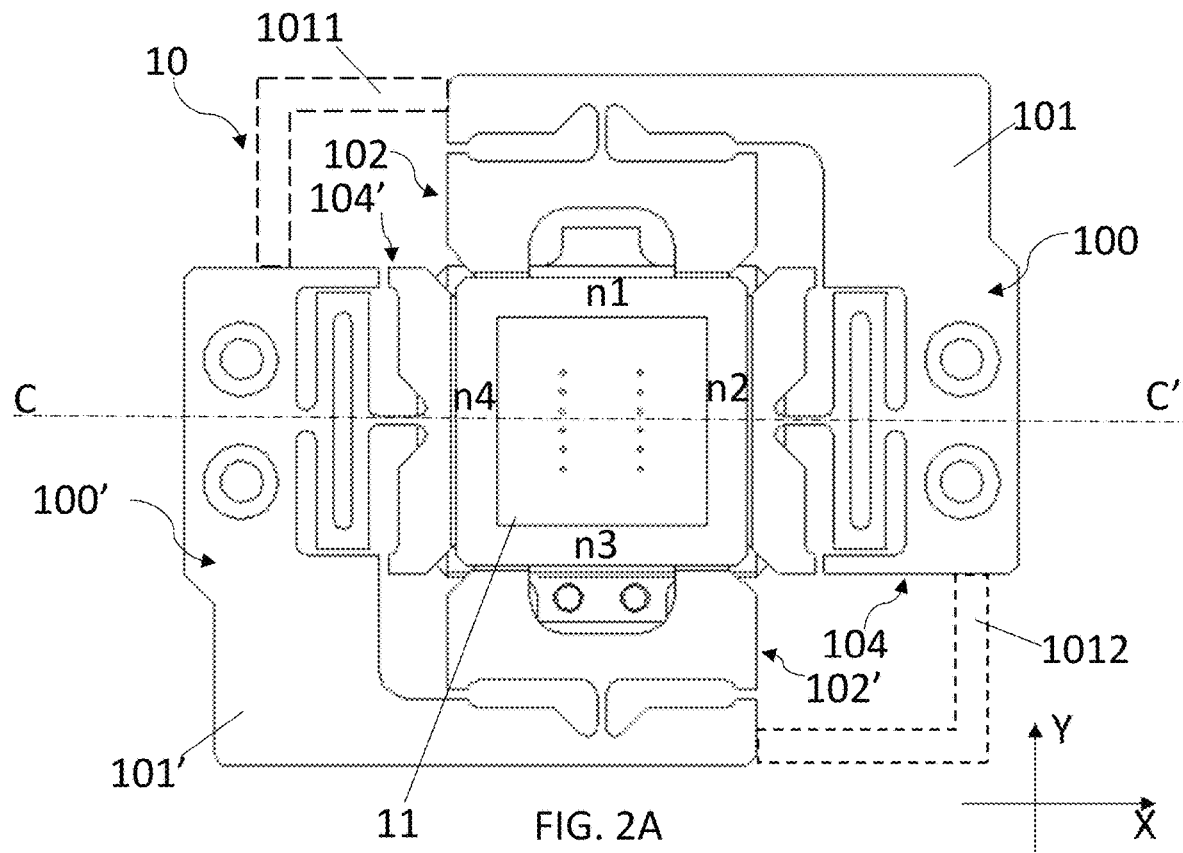
FIG. 2A is a bottom view of a bond head assembly that includes a collet and a pair of integrated locating pieces for restricting positional shifts of the collet according to some embodiments of the invention.
Figure 2B:
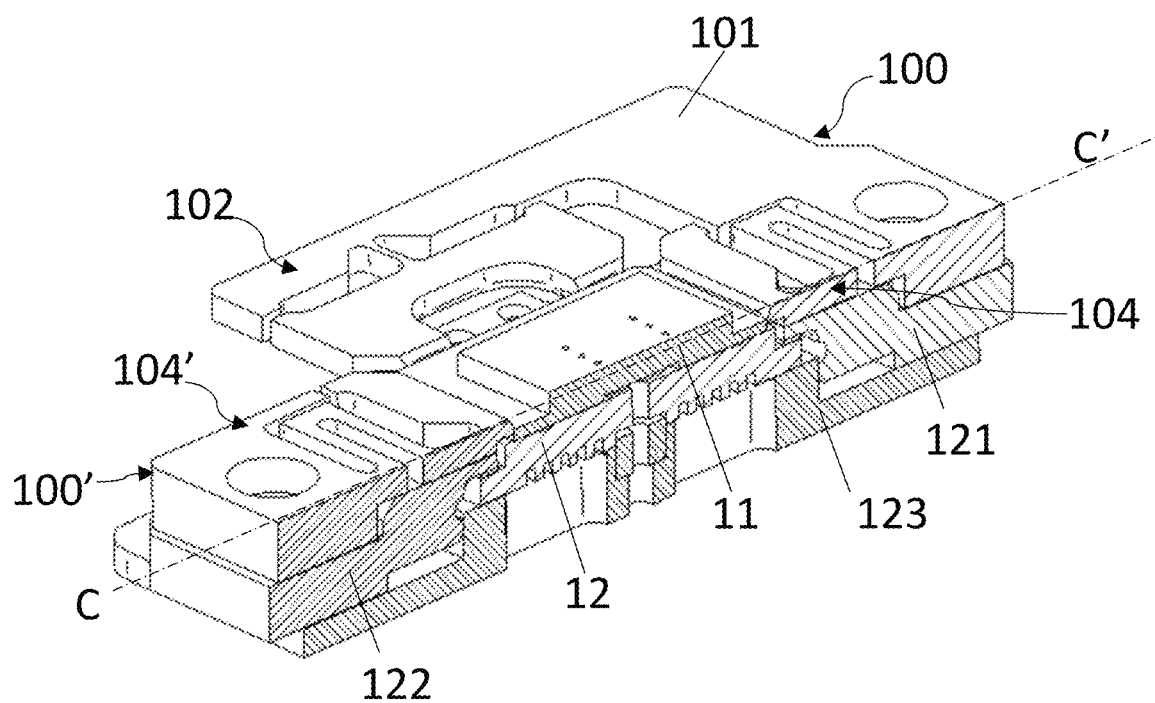
FIG. 2B is a perspective view of a part of the bond head assembly as shown in FIG. 2A, showing a cross-sectional view of the assembly along a line CC' in FIG. 2A.

FIG. 2A is a bottom view of a bond head assembly 10 including a collet 11 and a compliant locating structure for restricting positional shifts of the collet 11 during a die bonding process according to some embodiments of the invention. FIG. 2B is a perspective view of a part of the bond head assembly 10, showing a cross-sectional surface of the bond head assembly 10 along a line CC' as shown in FIG. 2A. It should be noted that when the bond head assembly 10 is in use, it should be positioned so that the collet 11 faces downward to allow a die held by the collet 11 to be bonded to a substrate located on a bonding station or stage. In FIG. 2B, the bond head assembly 10 is shown in an inverted position to clearly display the structure of the compliant locating structure and its positional relationship with other components of the bond head assembly 10.

Referring to FIG. 2A and FIG. 2B, the bond head assembly 10 includes a collet 11, a heater 12 and a planar compliant locating structure. The collet 11 has four side surfaces, n1 to n4, and is coupled to or mounted on or attached to the heater 12. The collet 11 is operative to hold a die to be bonded to a substrate during a bonding process. The heater 12 is mounted on a heater base 123 and secured by a heater clamping structure on which the compliant locating structure is mounted. The compliant locating structure includes a plurality of flexural elements that are arranged on a plane of the complaint locating structure.

As shown in FIG. 2A and FIG. 2B, the compliant locating structure includes first and second integrated locating pieces 100 and 100' which are securely mounted onto first and second retaining portions 121 and 122 of the heater clamping structure respectively. The first integrated locating piece 100 includes a first frame body 101, first and second flexural elements 102 and 104, and the second integrated locating piece 100' includes a second frame body 101', and third and fourth flexural elements 102' and 104'. In use, the first and second flexural elements 102 and 104 are positioned to contact side surfaces n1 and n2 of the collet 11, respectively. The side surfaces n1 and n2 of the collet 11 are substantially orthogonal to each other. Similarly, the third and fourth flexural elements 102' and 104' are positioned to contact side surfaces n3 and n4 of the collet 11 respectively. The side surfaces n3 and n4 are substantially orthogonal to each other. When installing the compliant locating structure, the collet 11 is inserted centrally between the four flexural elements 102, 104, 102', and 104'. In some embodiments, the collet 11 is installed such that clearances with predetermined widths are formed between each of the four flexural elements 102, 104, 102', and 104' and the corresponding side surface of the collet 11. These clearances are provided to achieve a higher margin of safety against fatigue failure of the flexural elements and to reduce the maximum contact force exerted on the side surfaces of the collet 11 during the heating phase of the bonding process. Each of the flexural elements 102, 104, 102', and 104' is arranged such that a portion thereof is deflectable by movement of the collet 11 against the flexural element 102, 104, 102' or 104'. The deflection of the portion of the flexural element 102, 104, 102' or 104' causes the flexural element 102, 104, 102' or 104' to exert a biasing force against the corresponding side surface n1, n2, n3 or n4 of the collet 11 along the plane of the complaint locating structure to counter and restrict positional shifts of the collet 11 towards the flexural element 102, 104, 102' or 104'.

The first and second integrated locating pieces 100 and 100' have the same structure. Below the first integrated locating piece 100 is taken as an example to explain the detailed structure of each flexural element 102, 104, 102' or 104' included in the first and second integrated locating pieces 100 and 100'.

Figure 3A:
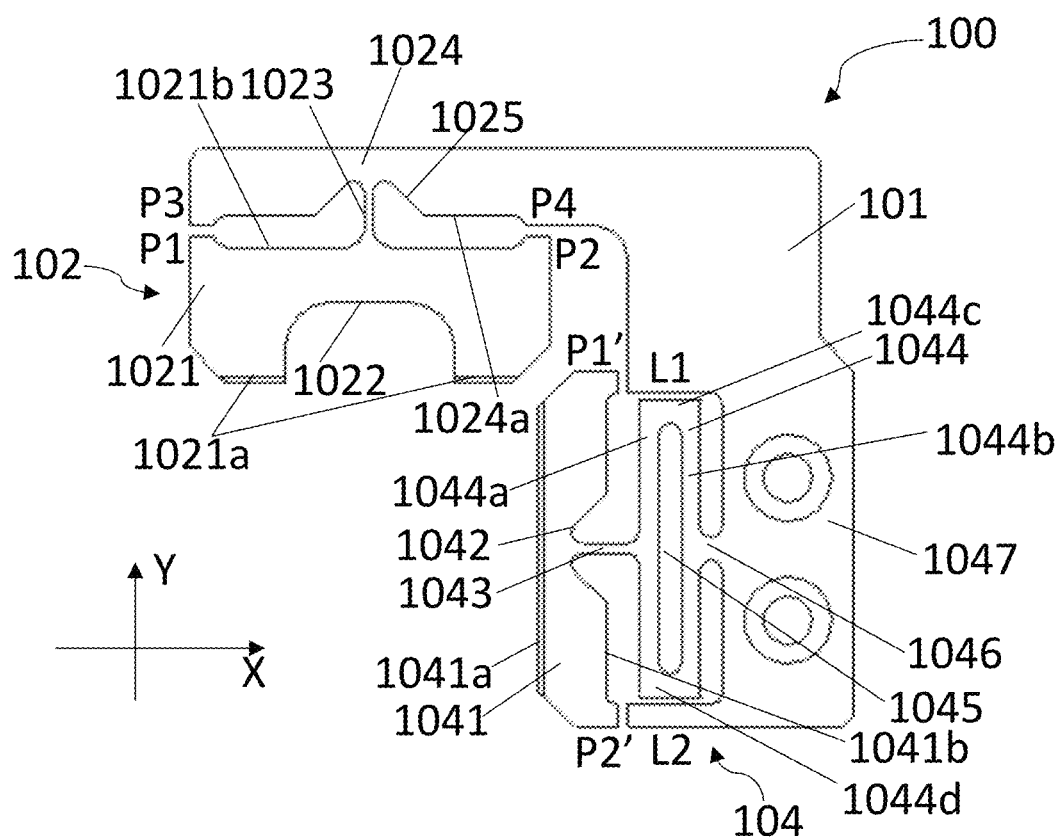
FIG. 3A is a plan view of one of the integrated locating pieces as shown in FIG. 2A.
Figure 3B:
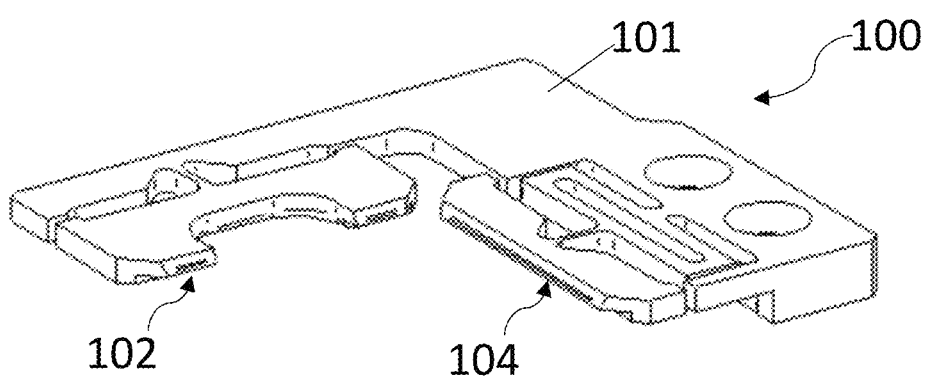
FIG. 3B is a perspective view of the integrated locating piece as shown in FIG. 3A.

FIG. 3A is a plan view of the first integrated locating piece 100 for restricting positional shifts of the collet 11 of the bond head assembly 10 during a die bonding process according to some embodiments of the invention. FIG. 3B is a perspective view of the first integrated locating piece 100. Referring to FIG. 3A and FIG. 3B, the three parts of the first integrated locating piece 100, i.e., the first frame body 101, and the first and second flexural elements 102 and 104, are combined into an integrally-formed L-shaped planar object. The first and second flexural elements, 102 and 104, are respectively positioned at the two perpendicular arms of the L-shaped object. On the first frame body 101, there are two holes for fixedly mounting the integrated locating piece 100 on the bond head assembly 10 with fixing means, such as screws. The two holes may be positioned adjacent to the second flexural element 104.

As shown in FIG. 3A, the first flexural element 102 includes a first contact portion 1021, a first pivotal portion 1023 and a first linear portion 1024. The first pivotal portion 1023 is positioned between the first contact portion 1021 and the first linear portion 1024 to operatively connect the first contact portion 1021 to the first linear portion 1024. In use, the first flexural element 102 is positioned to contact the first side surface n1 of the collet 11 and is arranged such that a portion of the first flexural element 102 is deflectable by movement of the collet 11 against the first flexural element 102, thereby causing the first flexural element 102 to exert a biasing force against the first side surface n1 of the collet 11 along the plane of the complaint locating structure to counter and restrict positional shifts of the collet 11 towards the first flexural element 102. Specifically, the first flexural element 102 is deflectable in response to a contact force caused by movement of the collet along a first direction, i.e., Y-axis direction, to impart a biasing force against the first side surface n1 of the collet 11. When the collet 11 expands or shifts due to thermal expansion or other factors, the first side surface n1 of the collet 11 contacts the first flexural element 102. This interaction generates a biasing force that is exerted against the first side surface n1 of the collet 11 to counter and restrict positional shifts of the collet 11 towards the first flexural element 102 along the first direction.

The first contact portion 1021 is configured to engage with the first side surface n1 of the collet 11 to impart the biasing force against the first side surface n1. The first contact portion 1021 has first and second surfaces 1021a and 1021b opposite to each other. The first surface 1021a includes a first notch 1022 that is sized and shaped to prevent contacting high voltage terminals of the heater 12 of the bond head assembly 10. The second surface 1021b connects to the first linear portion 1024 through the first pivotal portion 1023. The first surface 1021a includes two separate contact surfaces of the first flexural element 102, which are engageable with the first side surface n1 of the collet 11.

The first pivotal portion 1023 is configured to flex to enable rotation of the first contact portion 1021 relative to the first linear portion 1024. A gap is formed between the first contact portion 1021 and the first linear portion 1024 to allow the first contact portion 1021 to pivot about the first pivotal portion 1023. The first linear portion 1024 is configured to enable linear translation of the first contact portion 1021 due to movement of the collet 11 relative to the first flexural element 102.

The first pivotal portion 1023 has a first end connected to the second surface 1021b of the first contact portion 1021 and a second end connected to the first linear portion 1024. The first linear portion 1024 includes a flexible metallic plate connected to the first frame body 101 to form a cantilevered section which is deflectable away from the first contact portion 1021 when the collet 11 moves towards the first contact portion 1021. Specifically, the cantilevered section is deflected away from the first contact portion 1021 along the Y-axis direction when the first side surface n1 of the collet 11 contacts the first contact portion 1021 and exerts a contact force to the first contact portion 1021 due to positional shifts of the collect 11 caused by thermal expansion or other factors.

The first linear portion 1024 has a first surface 1024a facing the second surface 1021b of the first contact portion 1021. On the first surface 1024a, a first indentation 1025 is provided for lengthening the first pivotal portion 1023. The first indentation 1025 may be a notch having an inverted V-shaped or W-shaped profile. The first pivotal portion 1023 extends outwardly from the deepest part/portion of the first indentation 1025. This design can increase the length of the first pivotal portion 1023 so as to distribute stress across a larger area, and also allows the first pivotal portion 1023 to be thicker, thereby extending the lifespan of the stopper 100 and reducing the cost of manufacturing as compared to a very thin flexure.

The pivotable rotation of the first contact portion 1021 relative to the first linear portion 1024 about the first pivotal portion 1023 enables the first surface 1021a of the first contact portion 1021 to make fuller contact with the first side surface n1 of the collet 11 by compliant rotation of the first contact portion 1021, even if the first side surface n1 of the collet is not exactly parallel to the contact surfaces of the first surface 1021a of the first contact portion 1021 due to imperfections in the shape of the collet 11 or errors in the installation of the compliant locating structure.

The gap between the first contact portion 1021 and the first linear portion 1024 is formed between the second surface 1021b of the first contact portion 1021 and the first surface 1024a of the first linear portion 1024. The width of the gap may vary along the X-axis direction due to the shape and position of the second surface 1021b and the first surface 1024a. The first contact portion 1021 further includes two protrusions, P1 and P2, extending from two opposite ends of the second surface 1021b towards the first surface 1024a of the first linear portion 1024. Similarly, two other protrusions, P3 and P4, are provided on the first surface 1024a of the first linear portion 1024 extending from the first surface 1024a towards the second surface 1021b of the first contact portion 1021. The protrusions P3 and P4 are arranged to directly face the corresponding protrusions P1 and P2. With this design, the pivotal motion of the first contact portion 1021 about the first pivotal portion 1023 can be stopped when a protrusion P1, P2 is in contact with another corresponding protrusion P3, P4. In other words, the plurality of protrusions acts as stoppers against the rotation of the first contact portion 1021 about the first pivotal portion 1023 beyond a predetermined range of angles. Therefore, these protrusions P1, P2, P3, and P4 can prevent the first pivotal portion 1023 from bending beyond its design limits, thereby increasing the operational lifetime of the first flexural element 102.

Referring to FIG. 3A, the second flexural element 104 includes a second contact portion 1041, a second pivotal portion 1043, and a second linear portion 1044. The second pivotal portion 1043 is positioned between the second contact portion 1041 and the second linear portion 1044 to operatively connect the second contact portion 1041 to the second linear portion 1044. In use, the second flexural element 104 is positioned to contact the second side surface n2 of the collet 11 and is arranged such that a portion of the second flexural element 104 is deflectable by movement of the collet 11 against the second flexural element 104, thereby causing the second flexural element 104 to exert a biasing force against the second side surface n2 of the collet 11 along the plane of the complaint locating structure to counter and restrict positional shifts of the collet 11 towards the second flexural element 104. Specifically, the second flexural element 104 is deflectable in response to a contact force caused by movement of the collet 11 along a second direction, i.e., the x-axis direction, to impart a biasing force against the second side surface n2 of the collet 11. When the collet 11 expands or shifts due to thermal expansion or other factors, the second side surface n2 of the collet 11 contacts the second flexural element 104. The interaction generates a biasing force that pushes back against the second side surface n2 of the collet 11 to counter or restrict the movement or positional shifts of the collet 11 along the second direction.

The second contact portion 1041 is configured to engage with the second side surface n2 of the collet 11 to impart the biasing force against the second side surface n2. The second side surface n2 is substantially perpendicular to the first side surface n1 of the collet 11. The second contact portion 1041 has first and second surfaces 1041a, 1041b opposite to each other. The first surface 1041a is connected to the second linear portion 1044 through the second pivotal portion 1043. The first surface 1041a is the contact surface of the second flexural element 104, which is engageable with the second side surface n2 of the collet 11. The second surface 1041b includes a second indentation 1042 at a center part. The second indentation 1042 is provided for lengthening the second pivotal portion 1043. The second indentation 1042 may be a notch having a V-shaped or W-shaped profile. This design can increase the length of the second pivotal portion 1043 so as to distribute stress across a larger distance, and also allows the second pivotal portion 1043 to be thicker, thereby extending the lifespan of the second flexural element 104 and reducing the cost of manufacturing compared to a very thin flexure.

The second pivotal portion 1043 is configured to flex to enable rotation of the second contact portion 1041 relative to the second linear portion 1044. A gap is formed between the second contact portion 1041 and the second linear portion 1044 to allow the second contact portion 1041 to pivot about the second pivotal portion 1043. The second linear portion 1044 is configured to enable linear translation of the second contact portion 1041 due to movement of the collet 11 relative to the second flexural element 104.

The second pivotal portion 1043 has first and second opposite ends. The first end is connected to the second surface 1041*b* of the second contact portion 1041 and the second end is connected to the second linear portion 1044. The second pivotal portion 1043 extends outwardly from the innermost part of the second indentation 1042 along the second direction. The second linear portion 1044 includes a slotted plate having a slot 1045 with two generally U-shaped sections along its perimeter, each U-shaped section being designed to flex when the slot 1045 receives a force. The U-shaped sections of the slot 1045 are configured to deflect away from the second contact portion 1041 substantially along the X-axis direction when the collet 11 moves towards and contacts the second contact portion 1041. In some embodiments, the slotted plate includes a first beam 1044*a*, a second beam 1044*b* and two joining connection parts 1044*c* and 1044*d*. The first and second beams 1044*a* and 1044*b* are arranged to be parallel to each other. The joining connection parts 1044*c* and 1044*d* are positioned at opposite ends of the first and second beams 1044*a* and 1044*b* to form the U-shaped sections of the slot 1045.

In some embodiments, the slotted plate may be cut out from a metallic plate. The slot 1045 runs along a main longitudinal direction of the metallic plate. The second linear portion 1044 is arranged to allow its main longitudinal direction to be substantially parallel to the first direction, i.e. the Y-axis direction. The first frame body 101 of the integrated locating piece 100 includes a cut-out shaped and sized to house the second linear portion 1044. The second linear portion 1044 is connected to the first frame body 101 through a neck-shaped connection portion 1046. Specifically, the connection portion 1046 is located between the second beam 1044*b* and the first frame body 101. The joining connection parts 1044*c* and 1044*d* are opposite to each other and positioned adjacent to two legs L1 and L2 of the U-shaped sections.

The second contact portion 1041 is pivotable relative to the second linear portion 1044 about the second pivotal portion 1043. This design enables the first surface 1041*a* of the second contact portion 1041 to make fuller contact with the second side surface n2 of the collet 11 by rotation of the second contact portion 1041, even if the second side surface n2 of the collet 11 is not parallel to the first surface 1041*a* of the second contact portion 1041 due to the imperfections in the shape of the collet 11 or errors in the installation of the compliant locating structure.

The gap between the second contact portion 1041 and the second linear portion 1044 is formed between the second surface 1041*b* of the second contact portion 1041 and the first beam 1044*a* of the second linear portion 1044. The width of the gap may vary along the Y-axis direction due to the shape and position of the second surface 1041*b* and the first beam 1044*a*. In some embodiments, the second contact portion 1041 further includes two protrusions, P1' and P2', respectively extending from two opposite ends of the second surface 1041*b* towards the first frame body 101. The two protrusions P1' and P2' respectively face the ends of the two legs L1 and L2 of the U-shaped cut-out of the first frame body 101. With this design, the pivotal motion of the second contact portion 1041 around the second pivotal portion 1043 can be stopped when the protrusions P1', P2', are in contact with the corresponding ends of the two legs L1 and L2. This protects the second pivotal portion 1043 from bending beyond its design limits, thereby increasing the operational lifetime of the second flexural element 104.

Alternatively, in some embodiments, the second contact portion 1041 may be sized to allow the two protrusions, P1' and P2' respectively to face two opposite ends of the first beam 1044*a* of the second linear portion 1044. Furthermore, two protrusions may be provided at the two ends of the first beam 1044*a* to respectively face the protrusions P1' and P2'. The plurality of protrusions acts as stoppers against the rotation of the second contact portion 1041 about the second pivotal portion 1043 beyond a predetermined range of angles.

Similar to the first integrated locating piece 100, the three parts of the second integrated locating piece 100', i.e., the second frame body 101', and the third and fourth flexural elements 102' and 104' are combined into an integrally-formed L-shaped planar object. The structure and functions of each element in the second integrated locating piece 100' are the same as the corresponding element in the first integrated locating piece 100. Therefore, they will not be described in detail. The second integrated locating piece 100' is securely mounted onto a second retaining portion 122 of the heater clamping structure, e.g., with screws that pass through two holes on the second frame body 101'.

During die bonding, positional shifts of the collet 11 along at least one direction may occur due to various factors such as differences in thermal expansion between the collet 11 and the heater 12, the die held by the collet 11 and the substrate to be bonded, vacuum holding conditions for the die and the collet 11, friction between the collet 11 and heater 12, as well as the parallelism and coplanarity of the die and the collet 11.

When a positional shift of the collet 11 along the Y-axis direction causes the first side surface n1 of the collet 11 to push against the first flexural element 102, a first contact force along the Y-axis direction is exerted on the first flexural element 102 such that the first linear portion 1024 is deflected. This deflection thereby causes the first flexure element 102 to exert a biasing force against the first side surface n1 of the collet 11 along the plane of the compliant locating structure to restrict the motion of the collet 11 along the Y-axis direction towards the first flexural element 102.

Similarly, when a positional shift of the collet 11 along the X-axis direction causes the second side n2 of the collet 11 to push against the second flexural element 104, a second contact force is exerted on the second flexural element 104 to deflect the second linear portion 1044 such that a biasing force along the plane of the complaint locating structure is generated and imparted against the second side surface n2 of the collet 11 in response to the second contact force to counter and restrict the motion of the collet 11 along the X-axis direction.

When a positional shift of the collet 11 along the opposite Y-axis direction causes the third side surface n3 of the collet 11 to push against the third flexural element 102', a third contact force is exerted on the third flexural element 102' to deflect its linear portion such that a biasing force is generated and imparted against the third side surface n3 of the collet 11 in response to the third contact force to counter and restrict the motions of the collet 11 along the opposite Y-axis direction.

When a positional shift of the collet 11 along the opposite X-axis direction causes the fourth side n4 of the collet 11 to push against the fourth flexural element 104', a fourth contact force is exerted on the fourth flexural element 104' to deflect its linear portion such that a biasing force is generated and imparted against the fourth side surface n4 of the collet 11 in response to the fourth contact force to restrict the motion of the collet 11 along the opposite X-axis direction.

When the collet 11 does not have a perfectly quadrilateral shape, e.g., one side surface of the collet 11 is not exactly orthogonal to its adjacent side surfaces such that the side surface is not parallel to a contact surface of the corresponding flexural element of the compliant locating structure, or the installation of the compliant stopping structure causes at least one contact surface thereof to not be parallel to the corresponding side surface of the collet 11, the pivotal portion of each flexural element is used to conform to the imperfect conditions automatically. Taking the side surface n1 of the collet 11 as an example, if the side surface n1 is not parallel to the contact surfaces of the first flexural element 102 due to an imperfection in the collet 11 or errors in the installation of the compliant locating structure, thermal expansion of the collet 11 may cause only a part of the side surface n1 to engage with the contact surfaces of the first flexural element 102 first. This results in a contact force exerted on the first flexural element 102, enabling the first contact portion 1021 to pivot about the first pivotal portion 1023 and allowing the contact surfaces of the first flexural element 102 to fully contact the first side surface n1 of the collet 11. This design helps protect the collet 11 from damage caused by localized points of high stress concentrations.

In some embodiments, the first and second integrated locating pieces 100 and 100' may be installed separately on the heater clamping structure. Alternatively, to further reduce the difficulty of installation so as to improve installation efficiency and accuracy, the two integrated locating pieces 100 and 100' may be connected to form a unitary body or integrally formed before installation. Referring to FIG. 2A, two connection elements 1011 and 1012 may be provided to connect two adjacent ends of the first and second integrated locating pieces 100 and 100'. One connection element 1011 is configured to connect the first linear portion of the first flexural element 102 and the second frame body 101' of the second integrated locating piece 100', and the other connection element 1012 is configured to connect the linear portion of the third flexural element 102' of the second integrated locating piece 100' and the first frame body 101 of the first integrated locating piece 100.

Embodiments of the invention also provide a die bonding system. The bonding system includes a bonding station/stage for holding a substrate to which a die is to be bonded during a bonding process, and a bond head assembly configured for bonding the die to the substrate, e.g., the bond head assembly 10 as shown in FIG. 2A. The bond head assembly at least includes a collet and a planar compliant locating structure having a plane. The collet is operative to hold the die during the bonding process. The planar compliant locating structure includes a first flexural element that is positioned to contact a first side surface of the collet and a second flexural element that is positioned to contact a second side surface of the collet. The first and second side surfaces of the collet are substantially orthogonal to each other. Each of the first and second flexural elements is arranged such that a portion thereof is deflectable by movement of the collet against the flexural element, thereby causing the first or second flexural element to exert a biasing force against the first or second side surface of the collet along the plane of the compliant locating structure to restrict positional shifts of the collet towards the flexural element.

Various modifications may be made to the above-described embodiments. In some embodiments, the compliant locating structure may include at least one flexural element for restricting positional shifts of the collet. The thickness of different parts of the planar complaint locating structure may be slightly different. For example, the frame body of each integrated locating piece may be thicker than other parts thereof. Each flexural element included in the compliant locating structure may be designed to have the same pivotal and linear portions, depending on the actual structure of the bond head assembly. For example, all the flexural elements may include the linear portions which are the same as the first linear portion 1024 included in the first flexural element 102, or the second linear portion 1044 included in the second flexural element 104. The material used for manufacturing the compliant locating structure may be the same as that used for the heater clamping structure for securing the heater 12, such as grade 5 titanium.

In some embodiments, the compliant locating structure may operate in association with rigid stoppers. For example, the compliant locating structure may include an integrated locating piece 100 for restricting positional shifts of the collet along the first and second directions, while the positional shifts along the third and fourth directions are limited by other rigid stoppers. The integrated locating piece may also be replaced with two separate flexural elements.

With the compliant locating structure, the positional shifts of the collet of the bond head assembly caused by various factors can be restricted automatically to maintain the alignment of the collet relative to the heater during the bonding process. Compared to prior art methods for repositioning the collet relative to the heater, it can enhance bonding quality and increase the throughput of the die bonding system. Furthermore, both the material and the design of the compliant locating structure are selected to provide adequate preloads to constrain the collet in place without exceeding its yield strength, thereby preventing damage to the collet.

Compared to conventional rigid stoppers for restricting the undesirable positional shifts of the collet, the compliant locating structure, which includes several flexural elements, offers auto-alignment features to accommodate imperfections in the collet's shape, such as non-alignment between adjacent side surfaces, as well as defective assembly of the compliant locating structure. The linear portion in each flexural element allows for thermal expansion of the collet without the collet experiencing a high compressive load on it. Utilizing linear portions can significantly reduce compressive loads on the collet during its thermal expansion, while also effectively controlling gradual positional shifts of the collet along multiple directions over many cycles of thermal expansion and contraction. Furthermore, the use of pivotal portions ensures area contact between the compliant locating structure and the collet, minimizing the risk of damage to the collet due to localized concentrations of high stress.

The invention described herein is susceptible to variations, modifications and/or additions other than those specifically described and it is to be understood that the invention includes all such variations, modifications and/or additions which fall within the spirit and scope of the above description.

The invention claimed is:

1. A bond head assembly comprising:
   a collet operative to hold a die during a die bonding process; and
   a planar compliant locating structure having a plane, the compliant locating structure including a first flexural element that is positioned to contact a first side surface of the collet and a second flexural element that is positioned to contact a second side surface of the collet, the first and second side surfaces of the collet being substantially orthogonal to each other;
   wherein each of the first and second flexural elements is arranged such that a portion thereof is deflectable by movement of the collet against the flexural element, thereby causing the first or second flexural element to exert a biasing force against the first or second side surface of the collet along the plane of the compliant locating structure to restrict positional shifts of the collet towards the flexural element.

2. The bond head assembly according to claim 1, wherein each of the first and second flexural elements comprises a contact portion that is configured to engage with the first or second side surface of the collet to impart the biasing force onto the collet.

3. The bond head assembly according to claim 2, wherein the contact portion further comprises multiple separate contact surfaces to contact respective portions of the first or second side surface of the collet.

4. The bond head assembly according to claim 2, wherein each of the first and second flexural elements further comprises a pivotal portion configured to flex to enable rotation of the contact portion, and a linear portion to enable linear translation of the contact portion due to movement of the collet relative to the flexural element.

5. The bond head assembly according to claim 4, wherein the pivotal portion is positioned between the contact portion and the linear portion to operatively connect the contact portion to the linear portion.

6. The bond head assembly according to claim 5, wherein each of the first and second flexural elements is arranged to further comprise a gap formed between the contact portion and the linear portion to allow the contact portion to pivot about the pivotal portion.

7. The bond head assembly according to claim 6, wherein each of the first and second flexural elements further comprises a plurality of protrusions extending from the contact portion and/or the linear portion, which act as stoppers against the rotation of the contact portion about the pivotal portion beyond a predetermined range of angles.

8. The bond head assembly according to claim 7, wherein the plurality of protrusions includes a first pair of protrusions extending from the contact portion towards the linear portion and a second pair of protrusions extending from the linear portion towards the contact portion.

9. The bond head assembly according to claim 4, wherein the linear portion comprises a slotted plate having a slot, a perimeter of the slot being configured to deflect away from the contact portion when the collet moves towards and contacts the contact portion.

10. The bond head assembly according to claim 9, wherein the slotted plate includes a first beam, a second beam parallel to the first beam, and joining connection parts at opposite ends of the first and second beams to connect the first beam to the second beam to form the slot.

11. The bond head assembly according to claim 10, wherein the first and second beams and one of the joining connection parts form a U-shaped perimeter of the slot.

12. The bond head assembly according to claim 4, wherein the linear portion includes a cantilevered section configured to deflect away from the contact portion when the collet moves towards and contacts the contact portion.

13. The bond head assembly according to claim 1, wherein the first and second flexural elements are formed integrally with each other to form an integrated locating piece.

14. The bond head assembly according to claim 13, wherein the first and second flexural elements share a same mounting position.

15. The bond head assembly according to claim 13, wherein the first and second flexural elements are formed integrally in the form of an L-shaped structure.

16. The bond head assembly according to claim 15, wherein the first and second flexural elements are cut out from a single metallic plate.

17. The bond head assembly according to claim 1, wherein the compliant locating structure further includes a third flexural element that is positioned to contact a third side surface of the collet and a fourth flexural element that is positioned to contact a fourth side surface of the collet, the third and fourth side surfaces of the collet being substantially orthogonal to each other, wherein each of the third and fourth flexural elements is arranged such that a portion thereof is deflectable by movement of the collet against the flexural element, thereby causing the third or fourth flexural element to exert a biasing force against the third or fourth side surface of the collet along the plane of the compliant locating structure to restrict positional shifts of the collet towards the flexural element.

18. The bond head assembly according to claim 17, wherein the third and fourth flexural elements are formed integrally with each other.

19. The bond head assembly according to claim 18, wherein the third and fourth flexural elements share a same mounting position.

20. A die bonding system comprising:
   a bonding station for holding a substrate to which a die is to be bonded, and
   a bond head assembly for bonding the die to the substrate, the bond head assembly comprising:
   a collet operative to hold the die during a bonding process, and
   a planar compliant locating structure having a plane, the complaint locating structure including a first flexural element that is positioned to contact a first side surface of the collet and a second flexural element that is positioned to contact a second side surface of the collet, the first and second side surfaces of the collet being substantially orthogonal to each other,
   wherein each of the first and second flexural elements is arranged such that a portion thereof is deflectable by movement of the collet against the flexural element, thereby causing the first or second flexural element to exert a biasing force against the first or second side surface of the collet along the plane of the compliant locating structure to restrict positional shifts of the collet towards the flexural element.

* * * * *